(12) United States Patent
Jin et al.

(10) Patent No.: US 11,671,759 B2
(45) Date of Patent: Jun. 6, 2023

(54) SPEAKER

(71) Applicant: AAC Microtech (Changzhou) Co., Ltd., Changzhou (CN)

(72) Inventors: Xin Jin, Shenzhen (CN); Weiwei Tao, Shenzhen (CN); Heng Pan, Shenzhen (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 58 days.

(21) Appl. No.: 17/536,112

(22) Filed: Nov. 29, 2021

(65) Prior Publication Data

US 2022/0210564 A1 Jun. 30, 2022

(30) Foreign Application Priority Data

Dec. 25, 2020 (CN) .......................... 202023199745.5

(51) Int. Cl.
| | | |
|---|---|---|
| *H04R 7/18* | (2006.01) | |
| *H04R 9/02* | (2006.01) | |
| *H04R 7/04* | (2006.01) | |
| *H04R 7/20* | (2006.01) | |
| *H04R 9/04* | (2006.01) | |
| *H04R 9/06* | (2006.01) | |
| *H05K 1/02* | (2006.01) | |

(52) U.S. Cl.
CPC .................. *H04R 9/02* (2013.01); *H04R 7/04* (2013.01); *H04R 7/18* (2013.01); *H04R 7/20* (2013.01); *H04R 9/043* (2013.01); *H04R 9/06* (2013.01); *H04R 2400/11* (2013.01); *H05K 1/028* (2013.01)

(58) Field of Classification Search
CPC ... H04R 7/04; H04R 7/18; H04R 7/20; H04R 9/02; H04R 9/043; H04R 9/06; H04R 2400/11; H04R 31/006; H05K 1/028; H05K 1/189; H05K 2201/10083
See application file for complete search history.

(56) References Cited

U.S. PATENT DOCUMENTS

| | | | |
|---|---|---|---|
| 2018/0027335 A1* | 1/2018 | Li ........................... | H04R 7/18 381/398 |
| 2020/0045471 A1* | 2/2020 | Song ....................... | H04R 9/06 |
| 2022/0174412 A1* | 6/2022 | Zhong .................... | H04R 9/025 |

* cited by examiner

*Primary Examiner* — Huyen D Le
(74) *Attorney, Agent, or Firm* — W&G Law Group

(57) ABSTRACT

Provided is a speaker, including: a frame, a first diaphragm and a flexible printed circuit board connected to the frame. The first diaphragm includes a first surface close to the flexible printed circuit board and arranged opposite to the flexible printed circuit board. The first surface is recessed along a direction departing from the flexible printed circuit board to form a glue slot. The first surface is connected to the flexible printed circuit board by glue to enable the glue to enter the glue slot. A thickness of the glue at a glue junction is increased to enhance strength of connection between the flexible printed circuit board and the first diaphragm to ensure reliability of mounting of the flexible printed circuit board on the first diaphragm, which may reduce a failure rate of the speaker.

10 Claims, 6 Drawing Sheets

SPEAKER

TECHNICAL FIELD

The present disclosure relates to the field of speaker technologies, and in particular, to a speaker.

BACKGROUND

A speaker is a transducer that converts electrical signals into sound signals, which is widely used in daily life.

A conventional speaker includes a frame, a diaphragm arranged on the frame and a flexible printed circuit board. Generally, the flexible printed circuit board is connected to the diaphragm by glue. When the speaker vibrates or collides, it is easy to cause the flexible printed circuit board to detach from the diaphragm and then lead to failure of the speaker, which is required to be improved.

Therefore, there is a need to provide a new speaker to solve the above technical problem.

SUMMARY

An objective of the present disclosure is to provide a speaker, so as to solve the current technical problem that when the speaker vibrates or collides, it is easy to cause the flexible printed circuit board to detach from the diaphragm and then lead to failure of the speaker.

The technical solution of the present disclosure is as follows.

A speaker is provided, including: a frame, a first diaphragm and a flexible printed circuit board connected to the frame, wherein the first diaphragm comprises a first surface close to the flexible printed circuit board and arranged opposite to the flexible printed circuit board, the first surface is recessed along a direction departing from the flexible printed circuit board to form a glue slot, and the first surface is connected to the flexible printed circuit board by glue to enable the glue to enter the glue slot.

As an improvement, a plurality of glue slots are provided and are spaced along an edge of the first diaphragm.

As an improvement, an orthographic projection of the first diaphragm has a rounded rectangle structure, and the plurality of glue slots are arranged at four rounded corners of the first diaphragm.

As an improvement, at least two of the plurality of glue slots are arranged at each of the four rounded corners, and adjacent glue slots of the plurality of glue slots are spaced from each other.

As an improvement, the plurality of glue slots are strip grooves.

As an improvement, the first diaphragm is provided with a limiting groove, and the first diaphragm is assembled on the frame through the limiting groove.

As an improvement, the first diaphragm comprises a main body portion and a first extension portion bending and extending from the main body portion toward the flexible printed circuit board, the main body portion has a rounded rectangle structure, the first diaphragm further comprises a second extension portion bending and extending from a rounded corner of the main body portion toward the flexible printed circuit board, the second extension portion and the first extension portion are spaced from each other to define the limiting groove, and the plurality of glue slots are arranged on the second extension portion.

As an improvement, the speaker further includes a second diaphragm arranged on one side of the flexible printed circuit board departing from the first diaphragm.

As an improvement, the speaker further includes a holder and a voice coil connected to the first diaphragm through the holder, wherein the holder is received in the frame, two flexible printed circuit boards are provided and are symmetrically arranged on two opposite sides of the holder, and the flexible printed circuit board comprises a first end connected to the first surface, a second end connected to the holder, and an elastic arm connecting the first end and the second end.

As an improvement, the holder is arranged in a ring shape and comprises a holder body, a first holder extension portion bending and extending from an outer periphery of the holder body to a direction away from the first diaphragm, and a second holder extension portion bending and extending from an inner periphery of the holder body to a direction away from the first diaphragm, the second end is fixed to the first holder extension portion, and the voice coil is fixed to the second holder extension portion.

The speaker according to present disclosure has the following beneficial effects. The first surface is recessed along a direction departing from the flexible printed circuit board to form a glue slot. The first surface is connected to the flexible printed circuit board by glue to enable the glue to enter the glue slot, so as to increase a thickness of the glue at a glue junction and then enhance strength of connection between the flexible printed circuit board and the first diaphragm to ensure reliability of mounting of the flexible printed circuit board on the first diaphragm, which may reduce a failure rate of the speaker.

DESCRIPTION OF EMBODIMENTS

Figure 1:
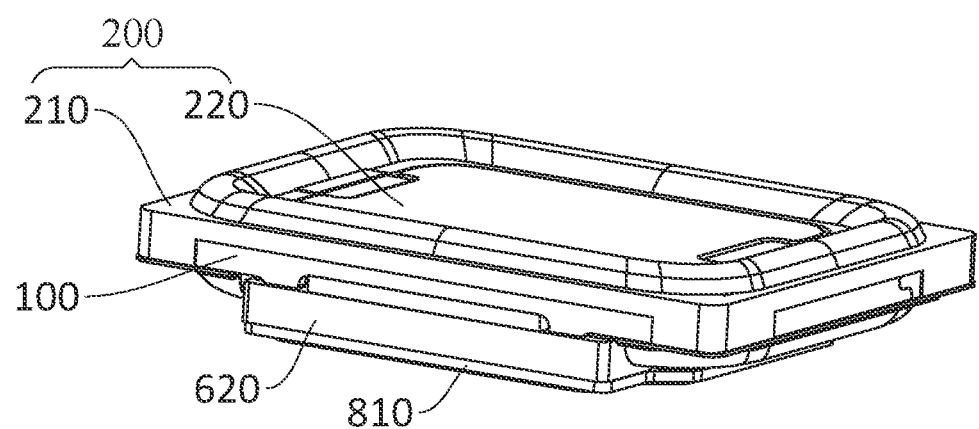
FIG. 1 is a schematic diagram of a speaker according to an embodiment of the present disclosure.

The present disclosure is further described below with reference to the accompanying drawings and embodiments.

Referring to FIG. 1 to FIG. 7, the present disclosure provides a speaker. The speaker includes: a frame 100, a first diaphragm 200 connected to the frame 100 and a flexible printed circuit board 300. The first diaphragm 200 includes a first surface 215 close to the flexible printed circuit board 300 and arranged opposite to the flexible printed circuit board 300. The first surface 215 is recessed along a direction departing from the flexible printed circuit board 300 to form a glue slot 211. The first surface 215 is connected to the flexible printed circuit board 300 by glue to enable the glue to enter the glue slot 211, so as to increase a thickness of the glue at a glue junction and then enhance strength of connection between the flexible printed circuit board 300 and the first diaphragm 200 to ensure reliability of mounting of the flexible printed circuit board 300 on the first diaphragm 200, which may reduce a failure rate of the speaker.

It may be understood that the arrangement of the glue slot 211 enables part of the glue to be received when the flexible printed circuit board 300 is glued with the first diaphragm 200, so as to increase a thickness of the glue layer and then enhance strength of connection of the glue layer, which may greatly enhance the strength of connection between the flexible printed circuit board 300 and the first diaphragm 200 compared with the solution of gluing of smooth planes between the conventional diaphragm and the flexible printed circuit board 300.

In one embodiment, a plurality of glue slots 211 are provided and are spaced along an edge of the first diaphragm 200, so as to further improve the strength of connection between the flexible printed circuit board 300 and the first diaphragm 200 and ensure the flexible printed circuit board 300 to be stably glued to the first diaphragm 200.

Optionally, an orthographic projection of the first diaphragm 200 is of a rounded rectangle structure, and the glue slots 211 are arranged at four rounded corners of the first diaphragm 200. The four rounded corners are four R-angle positions of the first diaphragm 200 to glue the flexible printed circuit board 300 with the first diaphragm 200, which facilitates the arrangement of the flexible printed circuit board 300 relative to the first diaphragm 200 and may improve space utilization of the speaker.

Further, at least two of the glue slots 211 are arranged at each of the rounded corners, and adjacent glue slots 211 are spaced, so as to improve the strength of connection between the flexible printed circuit board 300 and the first diaphragm 200 to further improve stability of the gluing between the flexible printed circuit board 300 and the first diaphragm 200.

Further, the glue slots 211 are strip grooves. The strip grooves facilitate slotting, which may reduce costs of slotting of the glue slots 211 on the first diaphragm 200, thereby reducing manufacturing costs of the speaker. In some other embodiments, the glue slots 211 may also S-shaped grooves or of other structures. In a case of same length space and specification of a glue slot 211, the S-shaped groove can hold more glue than the strip groove, thereby providing the glue layer with higher connection strength.

Figure 4:
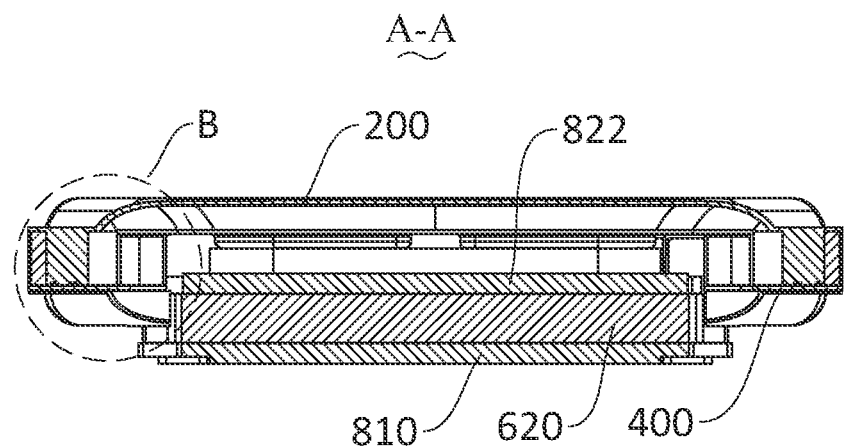
FIG. 4 is a sectional view taken along A-A of the speaker shown in FIG. 1.
Figure 5:
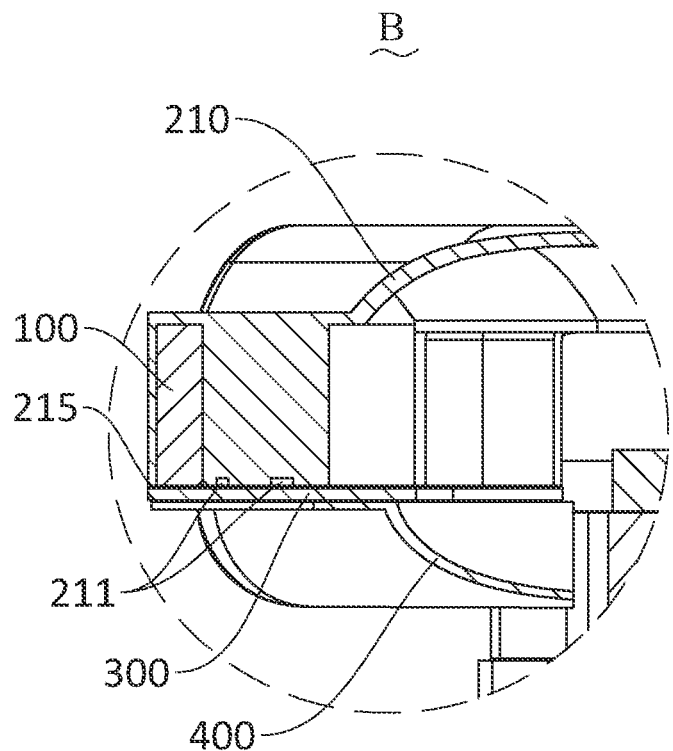
FIG. 5 is a schematic enlarged view of a part B of the speaker shown in FIG. 4.
Figure 6:
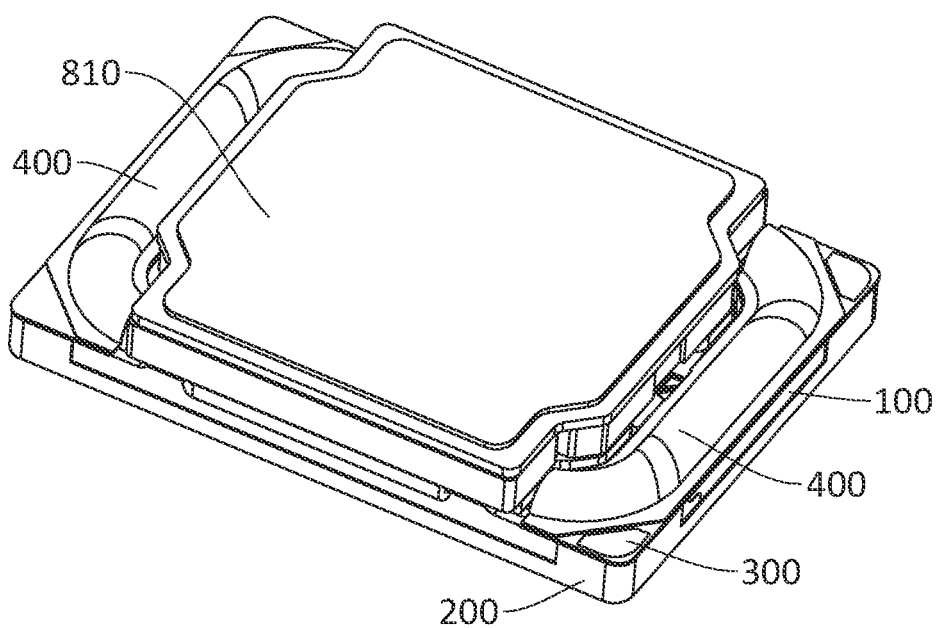
FIG. 6 is a schematic diagram of the speaker shown in FIG. 1 from another perspective.
Figure 7:
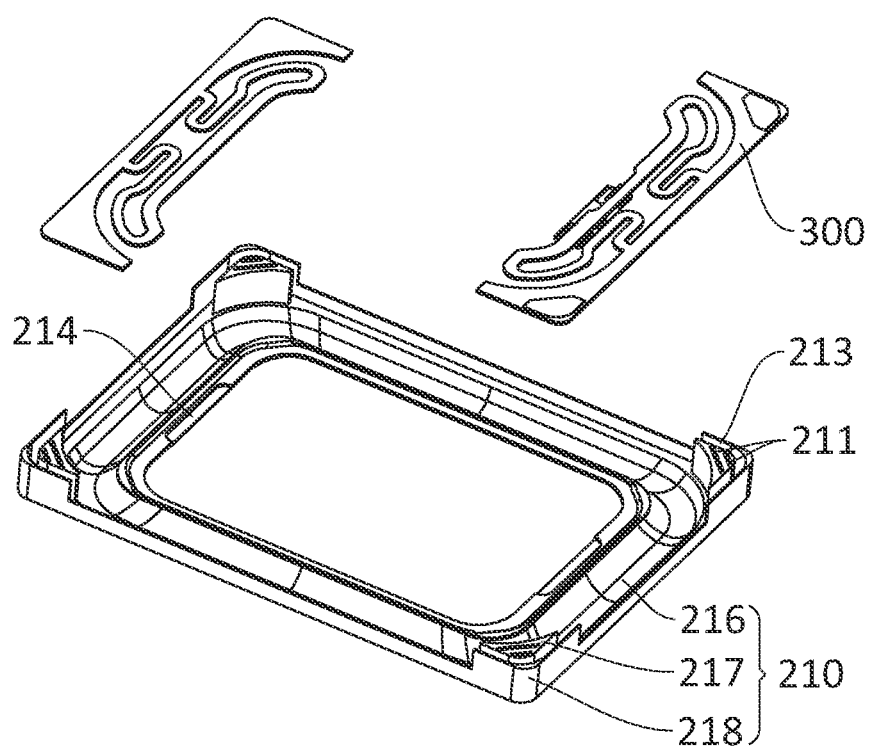
FIG. 7 is a schematic diagram of assembly between a flexible printed circuit board and a first diaphragm in the speaker shown in FIG. 1.

In one embodiment, referring to FIG. 4, FIG. 5 and FIG. 7, the first diaphragm 200 is provided with a limiting groove 213, and the first diaphragm 200 is assembled on the frame 100 through the limiting groove 213. The arrangement of the limiting groove 213 enables the first diaphragm 200 to be stably mounted on the frame 100.

Further, the first diaphragm 200 includes a main body portion 216 and a first extension portion 218 bending and extending from the main body portion 216 toward the flexible printed circuit board 300. The main body portion 216 is of a rounded rectangle structure. The first diaphragm 200 further includes a second extension portion 217 bending and extending from a rounded corner of the main body portion 216 toward the flexible printed circuit board 300. The second extension portion 217 and the first extension portion 218 are spaced from each other to define the limiting groove 213, so as to assemble the first diaphragm 200 on the frame 100 through the limiting groove 213, and the glue slots 211 are arranged on the second extension portion 217, so as to improve the strength of connection between the flexible printed circuit board 300 and the first diaphragm 200 at the position of the second extension portion 217 through the glue slots 211.

Figure 2:
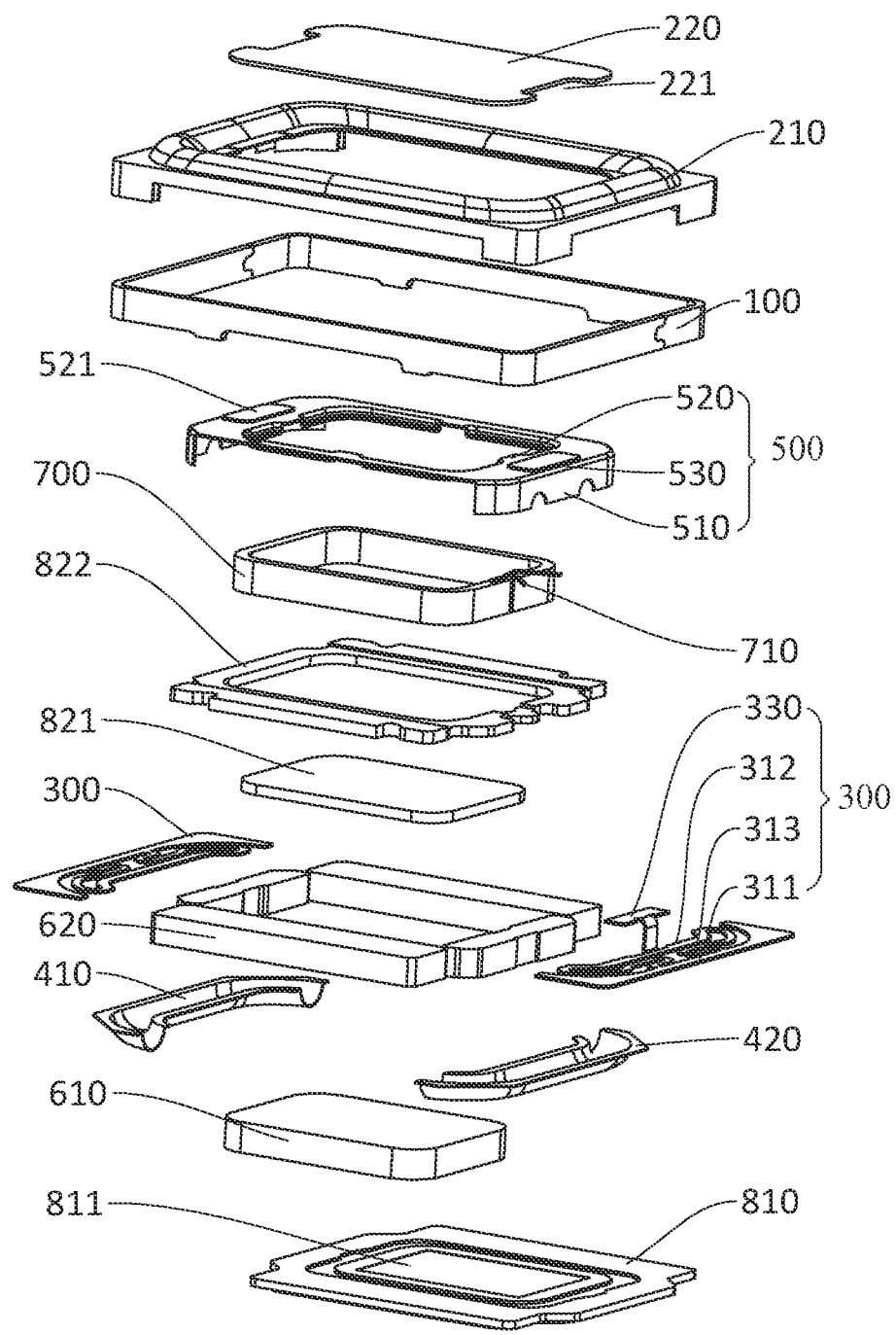
FIG. 2 is an exploded view of the speaker shown in FIG. 1.
Figure 3:
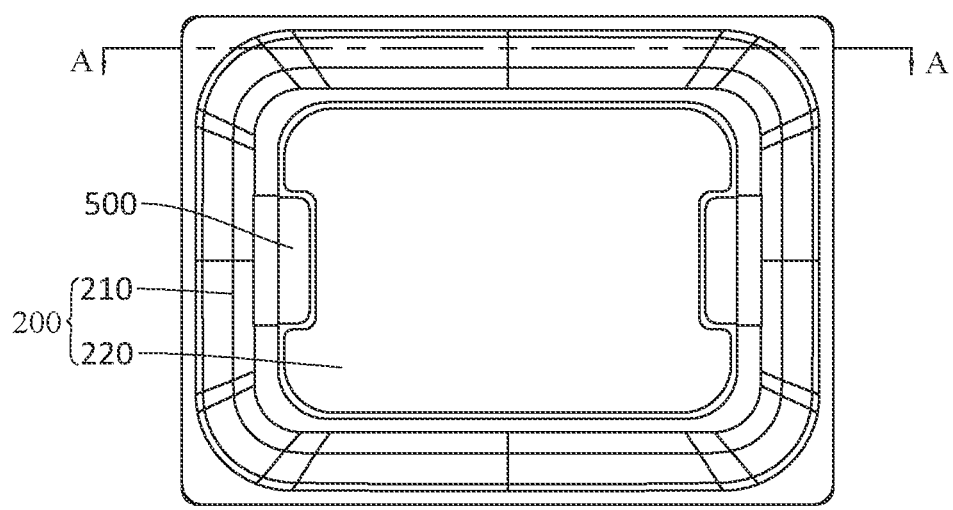
FIG. 3 is a top view of the speaker shown in FIG. 1.

In one embodiment, referring to FIG. 2 and FIG. 5, the speaker further includes a second diaphragm 400, and the second diaphragm 400 is arranged on one side of the flexible printed circuit board 300 departing from the first diaphragm 200, so as to arrange the flexible printed circuit board 300 between the first diaphragm 200 and the second diaphragm 400.

In one embodiment, the second diaphragm 400 includes a first part 410 and a second part 420. The first part 410 and the second part 420 are symmetrically arranged relative to the voice coil 700.

In one embodiment, referring to FIG. 2, FIG. 4, FIG. 5 and FIG. 7, the first diaphragm 200 includes a first suspension 210 and a dome 220 arranged in the middle of the first suspension 210.

Further, the limiting groove 213 is an L-shaped groove, so as to improve the strength of assembly between the first suspension 210 and the frame 100.

In one embodiment, the speaker further includes a holder 500 and a voice coil 700 connected to the first diaphragm 200 through the holder 500. The holder 500 is received in the frame 100, two flexible printed circuit boards 300 are provided and are symmetrically arranged on two opposite sides of the holder 500, and the flexible printed circuit board 300 includes a first end 311 connected to the first surface 215, a second end 312 connected to the holder 500 and an elastic arm 313 connecting the first end 311 and the second end 312, so as to realize stably mounting of the flexible printed circuit board 300.

The arrangement of the elastic arm 313 may improve impact resistance of the flexible printed circuit board 300 and prevent the impact of the vibration of the holder 500 on the flexible printed circuit board 300, so as to improve the stability of operation of the flexible printed circuit board 300.

Further, the dome 220 is placed on the holder 500, so as to realize the mounting of the dome 220.

In one embodiment, the holder 500 is arranged in a ring, the holder 500 includes a holder body 530, a first holder extension portion 510 bending and extending from an outer periphery of the holder body 530 to a direction away from the first diaphragm 200, and a second holder extension portion 520 bending and extending from an inner periphery of the holder body 530 to a direction away from the first diaphragm 200. The second end 312 is fixed to the first holder extension portion 510, and the voice coil 700 is fixed to the second holder extension portion 520.

In one embodiment, one side of the holder body 530 close to the first diaphragm 200 is connected to the dome 220 and the first suspension 210, so as to connect the dome 220 with the first suspension 210 through the holder 500 to form a whole.

Optionally, the second holder extension portion 520 is provided with a positioning protrusion 521, and the dome 220 is provided with a positioning opening 221 engaging with the positioning protrusion 521. The positioning opening 221 can stably engage with the positioning protrusion 521, so as to realize a stable connection between the dome 220 and the holder 500.

In one embodiment, referring to FIG. 7, the first suspension 210 is provided with a mounting groove 214. The mounting groove 214 is connected to at least part of the positioning protrusion 521, so as to realize a stable connection between the first suspension 210 and the holder 500 to improve the strength of the connection between the first suspension 210 and the holder 500.

In one embodiment, referring to FIG. 2, the speaker further includes a voice coil 700 and a magnetic circuit unit. The magnetic circuit unit includes a first magnet 610 and a second magnet 620 forming a magnetic gap with the first magnet 610. It may be understood that the first magnet 610 and the second magnet 620 are spaced to form an annular magnetic gap. The voice coil 700 is at least partially received in the magnetic gap.

Further, the flexible printed circuit board 300 is electrically connected to the voice coil 700 and configured to drive the voice coil 700 to operate.

In one embodiment, the voice coil 700 further includes a voice coil lead wire 710, the flexible printed circuit board 300 is provided with a solder portion 330, and the voice coil lead wire 710 is soldered to the solder portion 330, so as to realize an electrical connection between the flexible printed circuit board 300 and the voice coil 700.

In one embodiment, the speaker further includes a lower clamp plate 810, a first upper clamp plate 821 and a second upper clamp plate 822. The first upper clamp plate 821 covers the first magnet 610. The second upper clamp plate 822 covers the second magnet 620.

Optionally, the second magnet 620 includes a plurality of magnetic components. The plurality of magnetic components are enclosed to form a ring-shaped second magnet 620, which facilitates the manufacturing of the second magnet 620.

Optionally, the lower clamp plate 810 is provided with a positioning groove 811. The first magnet 610 is placed in the positioning groove 811, so as to realize stable placement of the first magnet 610 on the lower clamp plate 810.

It is to be noted that "a plurality of" mentioned in the present disclosure means two or more. The terms "first" and "second" are intended only for descriptive purposes only, which cannot be construed as indicating or implying a relative importance or implicitly specifying the number of the indicated technical features.

The above are only embodiments of the present disclosure. It should be pointed out that those of ordinary skill in the art may also make improvements without departing from the ideas of the present disclosure, all of which fall within the protection scope of the present disclosure.

What is claimed is:

1. A speaker, comprising: a frame, a first diaphragm and a flexible printed circuit board connected to the frame, wherein the first diaphragm comprises a first surface close to the flexible printed circuit board and arranged opposite to the flexible printed circuit board, the first surface is recessed along a direction departing from the flexible printed circuit board to form a glue slot, and the first surface is connected to the flexible printed circuit board by glue to enable the glue to enter the glue slot.

2. The speaker as described in claim 1, wherein a plurality of glue slots are provided and are spaced along an edge of the first diaphragm.

3. The speaker as described in claim 2, wherein an orthographic projection of the first diaphragm has a rounded rectangle structure, and the plurality of glue slots are arranged at four rounded corners of the first diaphragm.

4. The speaker as described in claim 3, wherein at least two of the plurality of glue slots are arranged at each of the four rounded corners, and adjacent glue slots of the plurality of glue slots are spaced from each other.

5. The speaker as described in claim 4, wherein the plurality of glue slots are strip grooves.

6. The speaker as described in claim 1, wherein the first diaphragm is provided with a limiting groove, and the first diaphragm is assembled on the frame through the limiting groove.

7. The speaker as described in claim 6, wherein the first diaphragm comprises a main body portion and a first extension portion bending and extending from the main body portion toward the flexible printed circuit board, the main body portion has a rounded rectangle structure, the first diaphragm further comprises a second extension portion bending and extending from a rounded corner of the main body portion toward the flexible printed circuit board, the second extension portion and the first extension portion are spaced from each other to define the limiting groove, and the plurality of glue slots are arranged on the second extension portion.

8. The speaker as described in claim 1, further comprising a second diaphragm arranged on one side of the flexible printed circuit board departing from the first diaphragm.

9. The speaker as described in claim 8, further comprising a holder and a voice coil connected to the first diaphragm through the holder, wherein the holder is received in the frame, two flexible printed circuit boards are provided and are symmetrically arranged on two opposite sides of the holder, and the flexible printed circuit board comprises a first end connected to the first surface, a second end connected to the holder, and an elastic arm connecting the first end and the second end.

10. The speaker as described in claim 9, wherein the holder is arranged in a ring shape and comprises a holder body, a first holder extension portion bending and extending from an outer periphery of the holder body to a direction away from the first diaphragm, and a second holder extension portion bending and extending from an inner periphery of the holder body to a direction away from the first diaphragm, the second end is fixed to the first holder extension portion, and the voice coil is fixed to the second holder extension portion.

* * * * *